(12) United States Patent
Myers et al.

(10) Patent No.: US 9,853,671 B2
(45) Date of Patent: Dec. 26, 2017

(54) COMPACT EJECTABLE COMPONENT ASSEMBLIES IN ELECTRONIC DEVICES

(71) Applicant: Apple Inc., Cupertino, CA (US)

(72) Inventors: Scott A. Myers, Cupertino, CA (US); Erik L. Wang, Cupertino, CA (US); Jason S. Sloey, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 117 days.

(21) Appl. No.: 14/618,568

(22) Filed: Feb. 10, 2015

(65) Prior Publication Data

US 2015/0155900 A1   Jun. 4, 2015

Related U.S. Application Data

(63) Continuation of application No. 13/914,100, filed on Jun. 10, 2013, now Pat. No. 8,960,818, which is a continuation of application No. 12/236,676, filed on Sep. 24, 2008, now Pat. No. 8,462,514.

(60) Provisional application No. 61/125,474, filed on Apr. 25, 2008.

(51) Int. Cl.
*H04B 1/3818* (2015.01)
*H04M 1/02* (2006.01)
*G06K 13/08* (2006.01)
*H04B 1/3816* (2015.01)
*H05K 5/02* (2006.01)

(52) U.S. Cl.
CPC ........... *H04B 1/3818* (2015.01); *G06K 13/08* (2013.01); *G06K 13/0831* (2013.01); *H04B 1/3816* (2013.01); *H04M 1/026* (2013.01); *H04M 1/0274* (2013.01); *H05K 5/0295* (2013.01); *H04M 1/0235* (2013.01); *H04M 1/0283* (2013.01); *H04M 2250/14* (2013.01)

(58) Field of Classification Search
CPC .. G06K 13/08; G06K 13/0831; H04B 1/3816; H05K 5/0295
See application file for complete search history.

(56) References Cited

U.S. PATENT DOCUMENTS

| | | | |
|---|---|---|---|
| 5,386,407 A | * | 1/1995 | Park ................... G11B 17/0434 360/99.06 |
| 5,655,917 A | | 8/1997 | Kaneshige et al. |
| 5,667,396 A | | 9/1997 | Pan et al. |
| 5,699,406 A | | 12/1997 | Liikanen et al. |
| RE36,511 E | | 1/2000 | Liou et al. |
| 6,089,889 A | * | 7/2000 | Chiou ................ H01R 13/6335 439/157 |

(Continued)

FOREIGN PATENT DOCUMENTS

TW            96213710 U  *  8/2007

*Primary Examiner* — William H Mayo, III
*Assistant Examiner* — Hiram E Gonzalez
(74) *Attorney, Agent, or Firm* — McDermott Will & Emery LLP

(57) ABSTRACT

Electronic devices are provided with ejectable component assemblies. The ejectable component assembly may include a tray that can be loaded with one or more removable modules, wafers coupled to circuit boards, cages and retaining plates to assist in retaining the tray within the assembly. The ejectable component assembly may include springs operative to engage detents in the tray to retain the tray in the assembly. The ejectable component assembly may include a tray ejector mechanism for ejecting the tray from the assembly.

17 Claims, 11 Drawing Sheets

(56) References Cited

U.S. PATENT DOCUMENTS

| | | |
|---|---|---|
| 6,216,339 B1 | 4/2001 | Rich |
| 6,421,246 B1 | 7/2002 | Schremmer |
| 6,814,597 B1 | 11/2004 | Kao |
| 7,280,846 B2 | 10/2007 | Lin |
| 7,381,096 B2 | 6/2008 | Alejandro et al. |
| 7,503,806 B2 * | 3/2009 | Lin ................... G06K 13/08 439/630 |
| 7,568,928 B2 * | 8/2009 | Hou ................ H01R 13/2442 439/188 |
| 7,589,977 B2 | 9/2009 | Lin |
| 7,837,092 B2 | 11/2010 | Wen |
| 7,837,486 B2 * | 11/2010 | Li ................... H01R 13/635 439/159 |
| 7,865,210 B2 | 1/2011 | Wang et al. |
| 2005/0282583 A1 | 12/2005 | Kawai et al. |

* cited by examiner

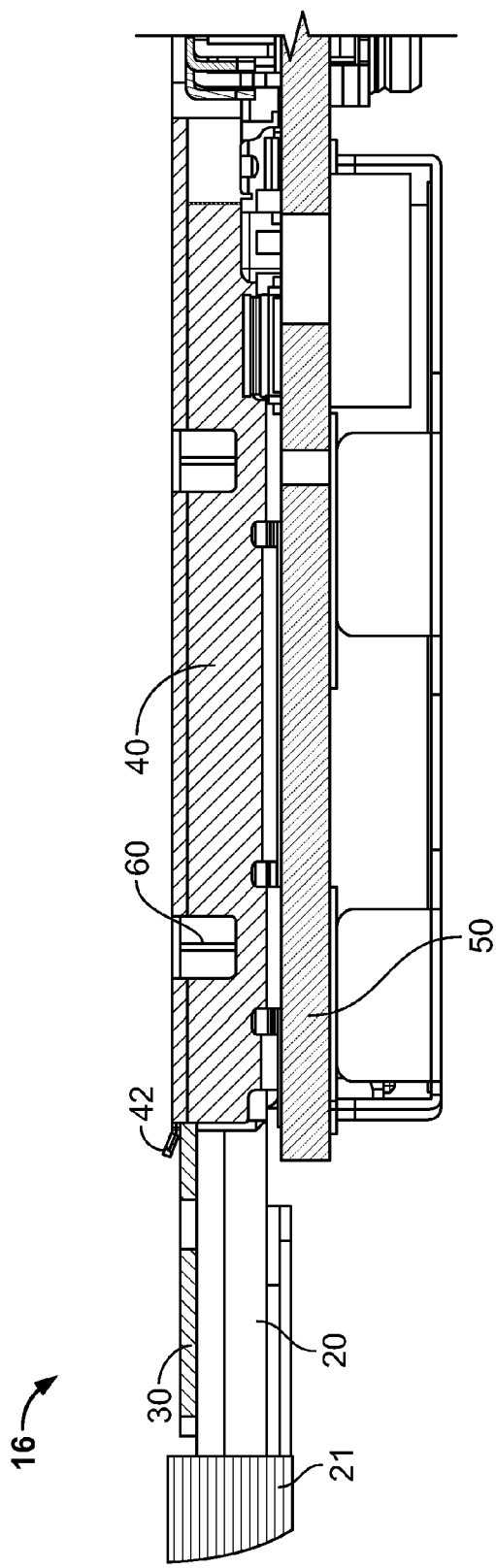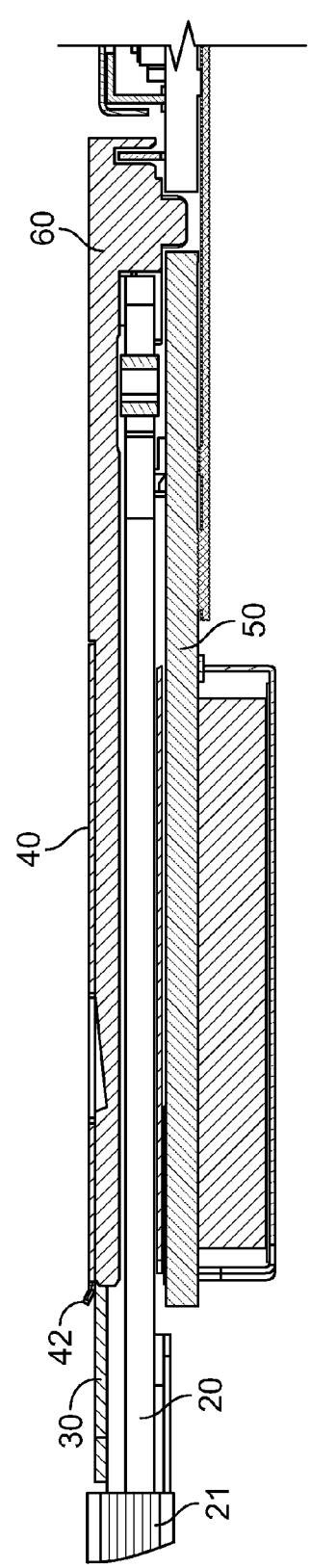

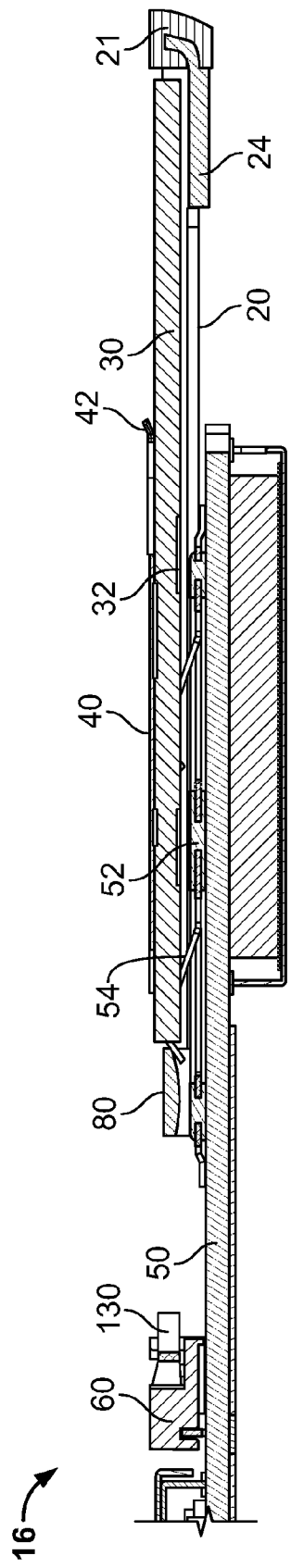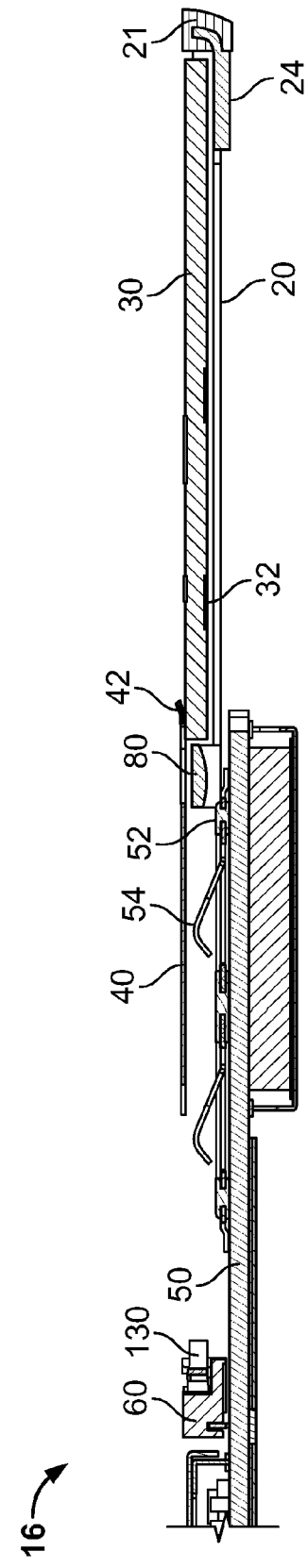
FIG. 10A
FIG. 10B

COMPACT EJECTABLE COMPONENT ASSEMBLIES IN ELECTRONIC DEVICES

CROSS-REFERENCE TO RELATED APPLICATIONS

This application is a continuation patent application of U.S. Ser. No. 13/914,100, filed Jun. 10, 2013 and titled "Compact Ejectable Component Assemblies in Electronic Devices," now U.S. Pat. No. 8,960,818, which is a continuation patent application of U.S. patent application Ser. No. 12/236,676, filed Sep. 24, 2008 and titled "Compact Ejectable Component Assemblies in Electronic Devices," now U.S. Pat. No. 8,462,514, which claims the benefit of U.S. Provisional Patent Application No. 61/125,474, filed Apr. 25, 2008 and titled "Compact Ejectable Component Assemblies in Electronic Devices," the disclosures of which are hereby incorporated by reference herein in their entireties.

BACKGROUND OF THE INVENTION

This invention relates to apparatuses and methods for providing compact ejectable component assemblies in electronic devices.

To enhance the use of electronic devices (e.g., cellular telephones), ejectable component assemblies may be used to couple removable modules to the device. Some known ejectable component assemblies for personal electronic devices include a tray for receiving a removable module, and a connector coupled to a circuit board within the housing of the device for receiving the tray as it is inserted through an opening in the housing. The connector may retain the tray such that the module is functionally connected to the circuit board. Variations in the manufacture of such electronic devices result in, for example, variations in the distance between the circuit board and the opening in the housing through which the tray of an ejectable component assembly is to be inserted. These manufacturing variations generally create an undesirable abruptness in the profile created by the tray and the external surface of the housing about its opening once the tray has been inserted.

Moreover, some known ejectable component assemblies for personal electronic devices also include an ejector coupled to the circuit board of the device for ejecting the tray from the connector and the housing of the device. The manufacturing variations of the device also tend to create variations in the distance between a user external to the device and the ejector, which in turn may increase the size of the electronic device.

SUMMARY OF THE INVENTION

A compact ejectable component assembly for use in an electronic device is provided.

According to some embodiments of the invention, an ejectable component assembly for use in an electronic device that includes a circuit board, a tray, and a cage may be provided. The tray may receive a removable module and be retained between the circuit board and the cage. The tray may include an opening through which the circuit board may establish an electrical connection with the module. In some embodiments, the ejectable component assembly may include a wafer that is electrically coupled to the circuit board and that extends into the opening in the tray to contact the module. In some embodiments, the ejectable component assembly may include a retaining plate with an extension that complements a protrusion in the tray. The extension may guide the tray when it is inserted into or ejected from the assembly. The extension may also assist in retaining the tray when fully inserted in the assembly.

In some embodiments, an electronic device having a housing, a circuit board, and a tray for receiving a module may be provided. The tray may include at least one detent. The electronic device may also include at least two springs that are operable to engage the at least one detent of the tray to retain the tray within the assembly. In some embodiments, the assembly may further include a compression spring that may be positioned behind one end of the tray within the assembly. The compression spring may compress when the tray is inserted into the assembly and decompress when the springs disengage from the detent to assist in ejecting the tray from the assembly.

In some embodiments, an electronic device having a housing, a tray for receiving a module, a cage for receiving the tray, and a retaining plate may be provided. The retaining plate may include at least one protrusion to engage a portion of the tray. In some embodiments, the retaining plate can include a ramp positioned such that an end of the tray rests on the ramp when the tray is within the assembly. The ramp may ensure that the module placed in the tray makes contact with the cage and prevent the module from slipping out of the tray during removal of the tray from the assembly. In some embodiments, the assembly may include an ejection mechanism operable to remove the tray from the assembly. The ejection mechanism may include an ejection arm and an actuating arm that may pivot about a pivot point when a suitable instrument applies force to a user contact plate. By pivoting, a tray contact plate may apply a force to a portion of the tray toward the exterior of the assembly to eject the tray from the assembly.

BRIEF DESCRIPTION OF THE DRAWINGS

The above and other features of the present invention, its nature and various advantages will be more apparent upon consideration of the following detailed description, taken in conjunction with the accompanying drawings in which:

FIG. 4 is a cross-sectional view of the ejectable component assembly of FIG. 3 taken from line IV-IV of FIG. 3 in accordance with some embodiments of the invention;

FIG. 5 is a cross-sectional view of the ejectable component assembly of FIG. 3 taken from line V-V of FIG. 3 in accordance with some embodiments of the invention;

FIG. 10A is a cross-sectional view of the ejectable component assembly of FIG. 2 taken from line X-X of FIG. 2 when the tray is in a first position in accordance with some embodiments of the invention;

FIG. 10B is a cross-sectional view of the ejectable component assembly of FIG. 2 taken from line X-X of FIG. 2 when the tray is in a second position in accordance with some embodiments of the invention;

DETAILED DESCRIPTION

Apparatus and methods are provided for improving the construction of ejectable component assemblies, and are described below with reference to FIGS. 1-12.

The following discussion describes some embodiments of an electronic device that includes at least one ejectable component assembly. The term "electronic device" can include, but is not limited to, music players, video players, still image players, game players, other media players, music recorders, video recorders, cameras, other media recorders, radios, medical equipment, calculators, cellular telephones, other wireless communication devices, personal digital assistants, remote controls, pagers, laptop computers, printers, or combinations thereof. In some cases, the electronic devices may perform a single function (e.g., an electronic device dedicated to playing music) and in other cases, the electronic devices may perform several functions (e.g., an electronic device that plays music, displays video, stores pictures, and receives and transmits telephone calls).

The electronic devices may generally be any portable, mobile, hand-held, or miniature electronic device so as to allow a user, for example, to listen to music, play games, record videos, take pictures, and/or conduct communications operations (e.g., telephone calls). Some miniature electronic devices may have a form factor that is smaller than that of hand-held electronic devices, such as an iPod™ available by Apple Inc. of Cupertino, Calif. Illustrative miniature electronic devices can be integrated into various objects that include, but are not limited to, watches, rings, necklaces, belts, accessories for belts, headsets, accessories for shoes, virtual reality devices, other wearable electronics, accessories for sporting equipment, accessories for fitness equipment, key chains, or any combination thereof. Alternatively, electronic devices that incorporate an ejectable component assembly may not be portable at all.

Figure 1:
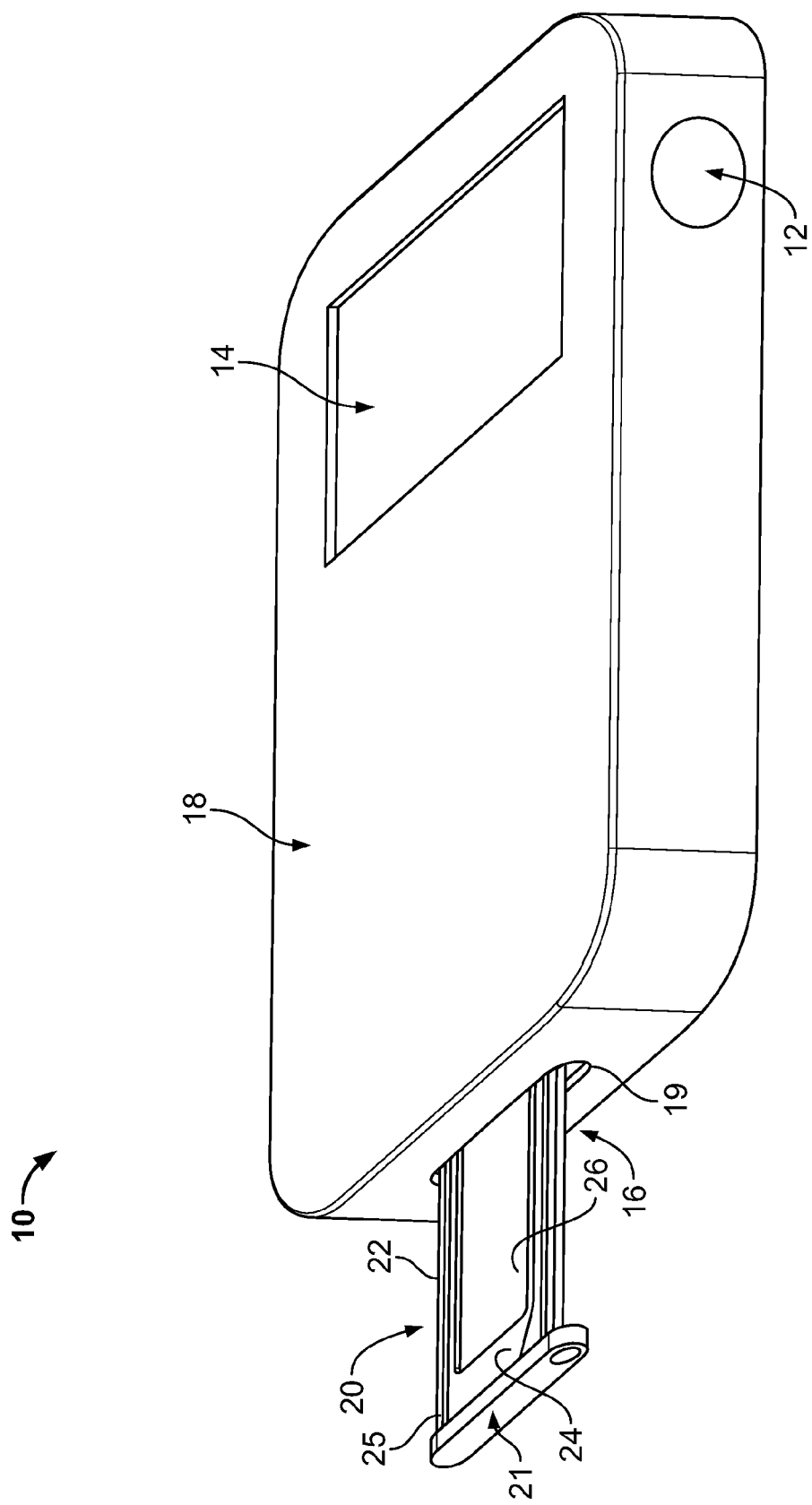
FIG. 1 is a perspective view of an illustrative electronic device that includes an ejectable component assembly in accordance with some embodiments of the invention.

FIG. 1 is a perspective view of an illustrative electronic device that includes an ejectable component assembly in accordance with some embodiments of the invention. Electronic device 10 can include at least one user input component assembly 12 that allows a user to interface with the device, at least one device output component assembly 14 that provides the user with device generated information, at least one ejectable component assembly 16 that allows a user to insert and eject a removable module into and from the device, and a protective housing 18 that at least partially encloses the one or more input, output, and ejectable component assemblies of the device.

Component assemblies 12, 14, and 16 can include any type of component assembly operative to receive and/or transmits digital and/or analog data (e.g., audio data, video data, other types of data, or a combination thereof). Input component assembly 12 may include any suitable input mechanism such as, for example, sliding switches, buttons, keypads, dials, scroll wheels, touch screen displays, electronics for accepting audio and/or visual information, antennas, infrared ports, or combinations thereof. Output component assembly 14 may include any suitable output component forms such as, for example, audio speakers, headphones, audio line-outs, visual displays, antennas, infrared ports, or combinations thereof. Ejectable component assembly 16 may include any suitable assembly operative to insert and eject a removable module from the device (see, e.g., removable module 30 of FIG. 2). The removable module may include, for example, integrated circuit cards (ICCs), chip cards, memory cards, flash memory cards, microprocessor cards, smart cards, such as subscriber identity module (SIM) cards, or combinations thereof. In some embodiments, the removable module may contain electronic circuitry from which the electronic device may read data and/or to which the device may write data.

Ejectable component assembly 16 can include module tray 20 that may be insertable into and ejectable from housing 18 through housing opening 19. In some embodiments, tray 20 may be fully removed from assembly 16 and/or device 10 when ejected, or instead may be restricted in some fashion from being completely removed from assembly 16 and/or device 10. For example, a portion of tray 20 may be restrained within assembly 16 when tray 20 is ejected from housing 18. Tray 20 may include module holder 24, first tray end 21, second tray end 23, and body portion 22 extending therebetween. First tray end 21 may include an aesthetically pleasing outer surface to provide a cosmetic surface. First tray end 21, second tray end 23, and body portion 22 may define the periphery and/or walls of module holder 24. Module holder 24 may be operative to receive and hold removable module 30.

Figure 2:
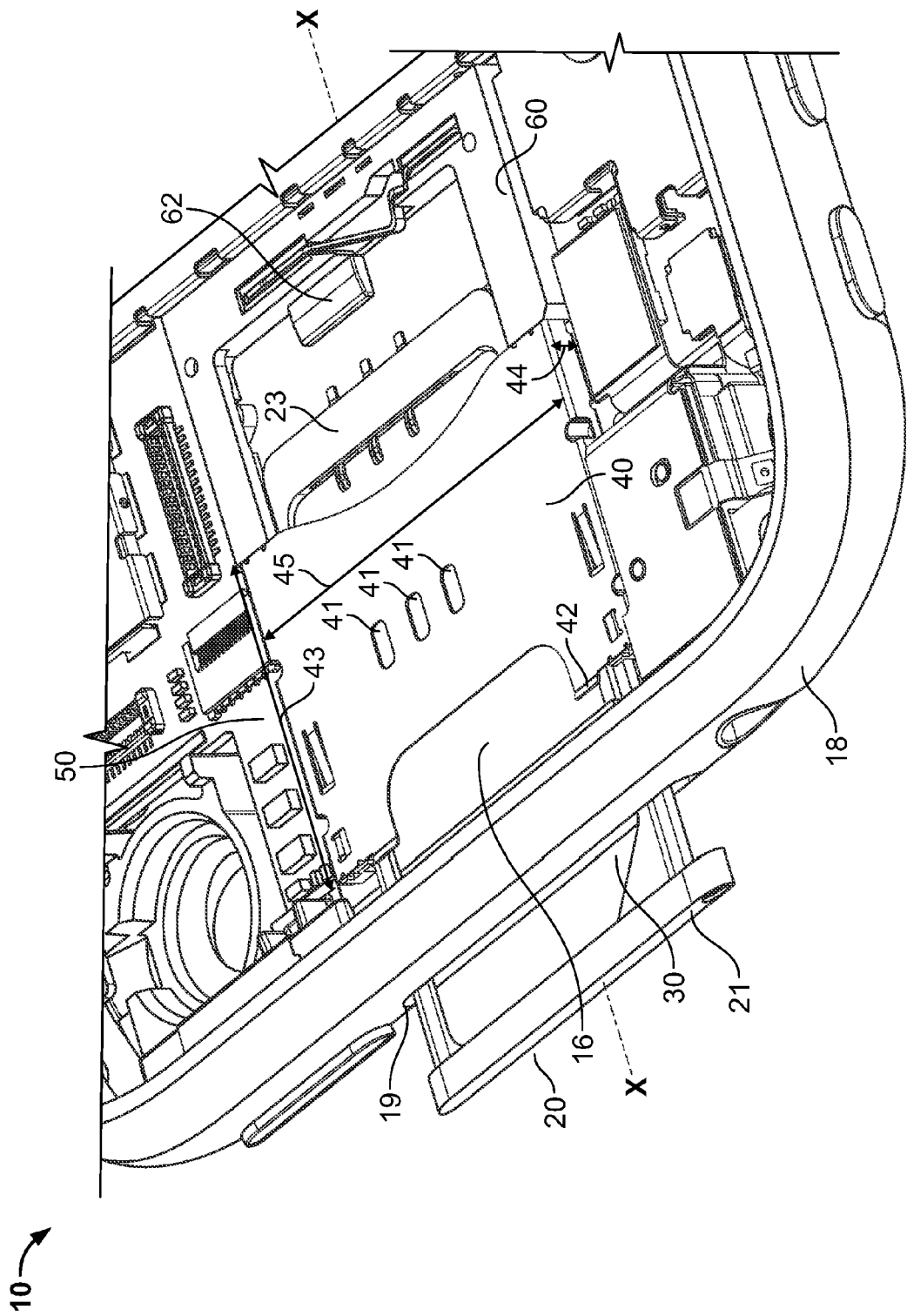
FIG. 2 is a perspective view of an illustrative ejectable component assembly when a tray is partially inserted in an electronic device in accordance with some embodiments of the invention.
Figure 3:
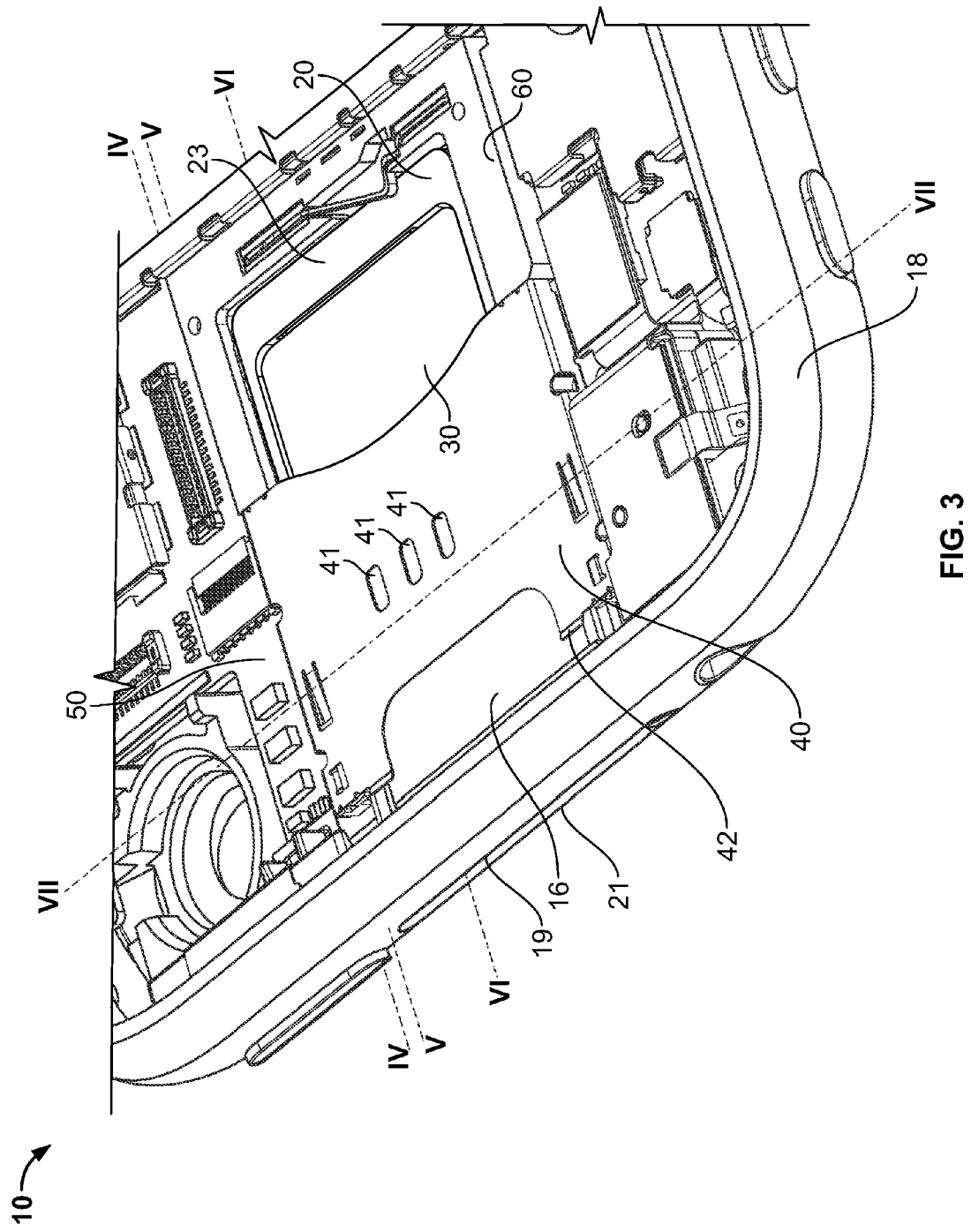
FIG. 3 is a perspective view of an illustrative ejectable component assembly when a tray is completely inserted in an electronic device in accordance with some embodiments of the invention.

FIG. 2 is a perspective view of an illustrative ejectable component assembly when a tray is partially inserted in an electronic device in accordance with some embodiments of the invention. FIG. 3 is a perspective view of an illustrative ejectable component assembly when a tray is completely inserted in an electronic device in accordance with some embodiments of the invention. In some embodiments, tray 20 may be inserted into or ejected from ejectable component assembly 16, which may include cage 40 operative to receive and/or restrain tray 20 and removable module 30. Cage 40 may be placed opposite circuit board 50 of electronic device 10 such that tray 20 may be positioned and retained between cage 40 and circuit board 50. For example, module 30 may be placed in tray 20 and slid into an opening of cage 40.

Cage 40 can include a top surface and at least two sidewalls. The top surface may be raised above circuit board 50 and the sidewalls may extend toward circuit board 50 from the top surface such that the sidewalls may be substantially perpendicular to the top surface (e.g., cage 40 may resemble an upside-down U-shape coupled to circuit board 50). The orientation of the top surface and side walls may allow space for tray 20 and/or module 30 to be retained within cage 40. For example, at least one interior surface of cage 40 may contact module 30 to retain module 30 in holder 24 when in cage 40. In some embodiments, at least one dimension of cage 40 may be substantially the same size as tray 20. For example, height 44 and width 45 of cage 40 may be substantially the same as the height and width of tray 20 and/or removable module 30, respectively. Cage 40 may have any suitable length 43. For example, cage 40 may or may not extend over the entirety of tray 20 when tray 20 is fully inserted into assembly 16.

Cage 40 may be coupled to any suitable component of assembly 16, circuit board 50 and/or device 10, and have any suitable shape. Cage 40 may be coupled to any suitable component using any suitable approach, including for example soldering, surface mount technology, welding, an adhesive, or any other suitable approach. Cage 40 may be formed of any suitable material, such as plastic, glass, metal, ceramic materials, epoxies, composite materials, or any other suitable material. Cage 40 may be formed using any suitable process, for example molding, casting, forming, forging, machining, joining, or any other suitable process.

If cage 40 is formed of a material or is coupled to an element that may store excess electrical charge, cage 40 may be grounded to a circuit board within device 10 or another conductive element within device 10 to dissipate the excess charge. This may help avoid excess charges built up in cage 40 damaging or corrupting the parts or processes taking place within assembly 16 and/or device 10.

Circuit board 50 may be any type of circuit board, including for example printed circuit boards (PCBs), logic boards, printed wiring boards, etched wiring boards, and other known boards that may be used to mechanically support and electronically connect electrical components (e.g., I/O component assemblies 12, 14, and 16 via coupling circuitries). Circuit board 50 can be constructed using one or more layers of a non-conductive substrate and signal conducting pathways. The signal conducting pathways may exist in one or more layers or in each layer of the non-conductive substrate. The signal conducting layers, sometimes referred to as traces, members, or leads, may be a metal conductive material (e.g., copper or gold) or an optical conductive material (e.g., fiber optics). When one or more of I/O component assemblies 12, 14, and 16 are physically and electrically coupled to board 50 via coupling circuitries, board 50 may communicate with the one or more component assemblies of device 10 using the signal conducting layers.

To retain tray 20 at portions over which cage 40 does not extend, assembly 16 may include retaining plate 60. Retaining plate 60 may be coupled to any suitable element within assembly 16, circuit board 50, and/or device 10. Retaining plate 60 may be of any suitable shape and placed in any suitable location within device 10 to retain at least portions of tray 20 and/or module 30. For example, retaining plate 60 can have a shape that substantially complements portions of tray 20 and/or module 30 when tray 20 and/or module 30 is fully or partially inserted into device 10. Retaining plate 60 may include curved front and rear edges which may prevent an edge of module 30 from catching on assembly 16 during insertion into or ejection from assembly 16.

Retaining plate 60 may be formed of any suitable material, including for example plastic, glass, metal, ceramic materials, epoxies, composite materials, or any other suitable material. Retaining plate 60 may be formed through any suitable process, for example, casting, molding, forming, forging, machining, joining, or combinations thereof. If retaining plate 60 is manufactured from a material that may store excess electrical charge, retaining plate 60 may be grounded to circuit board 50 or another conductive element within device 10 to dissipate the excess charge. This may help avoid excess charges built up in retaining plate 60 damaging or corrupting the parts or processes taking place within assembly 16 and/or device 10.

Retaining plate 60 may include wedge ramp 62 operative to assist in retaining module 30 in tray 20. Ramp 62 may be of any suitable shape and be placed in any suitable position within retaining plate 60. In some embodiments, ramp 62 may be positioned such that the tip of tray 20 (e.g., second tray end 23) is maintained away from circuit board 50. This may allow ramp 62 to bias tray 20 up to secure module 30 between module holder 24 and the bottom of cage 40, and prevent tray 20 from slipping underneath module 30 during removal (e.g., when the walls of module holder 24 are less than the height of module 30).

FIG. 4 is a cross-sectional view of the ejectable component assembly of FIG. 3 taken from line IV-IV of FIG. 3 in accordance with some embodiments of the invention. FIG. 4 may thus be a side view of assembly 16. Cage 40 may include lip 42 or other curved edges to prevent tray 20 and/or module 30 from catching on cage 40 during insertion or removable of tray 20 from assembly 16. Retaining plate 60 may extend into or through cage 40 to further assist in retaining tray 20 by providing more surface area for retaining plate 60 to contact and thus restrain tray 20.

Figure 6:
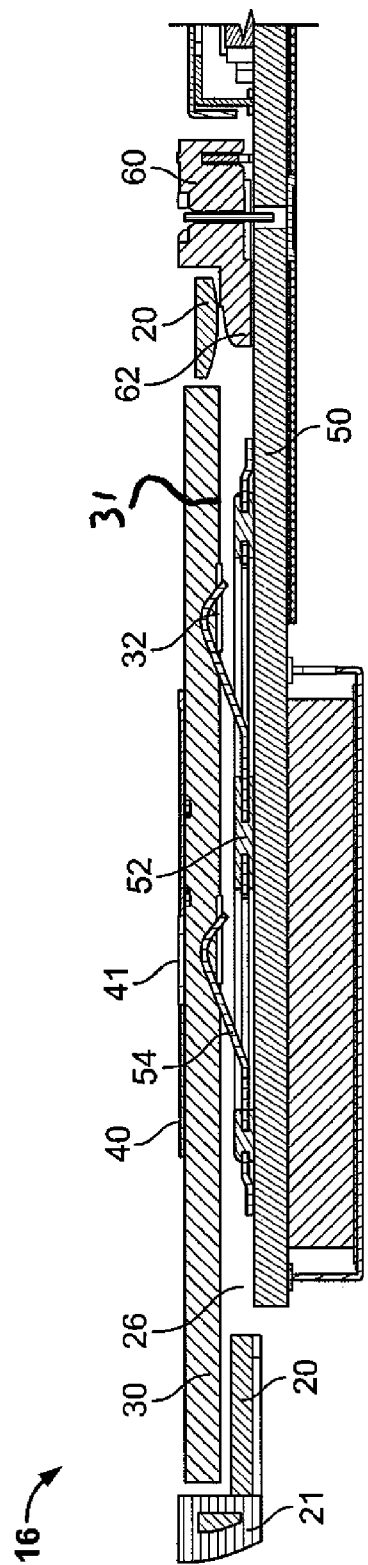
FIG. 6 is a cross-sectional view of the ejectable component assembly of FIG. 3 taken from line VI-VI of FIG. 3 in accordance with some embodiments of the invention.

FIG. 5 is a cross-sectional view of the ejectable component assembly of FIG. 3 taken from line V-V of FIG. 3 in accordance with some embodiments of the invention. FIG. 6 is a cross-sectional view of the ejectable component assembly of FIG. 3 taken from line VI-VI of FIG. 3 in accordance with some embodiments of the invention. FIGS. 5 and 6 may thus be cross sections of assembly 16 along different parallel planes. Assembly 16 may include wafer 52, which may be mechanically supported and electronically connected to other components in device 10 by circuit board 50. Wafer 52 can be, for example, any integrated circuit (IC) such as a microchip, silicon chip, or computer chip. In some embodiments, wafer 52 may provide an interface for module 30 to electrically communicate with other components in device 10. For example, wafer 52 may connect to an electrically conductive portion of module 30 (e.g., electronic circuitry 32).

In some embodiments, wafer 52 may include one or more electrical pins 54 extending beyond the periphery of wafer 52 to contact module 30. Electrical pins 54 may extend into opening 26 of tray 20 when tray 20 is at least partially inserted into assembly 16 to contact electronic circuitry 32 of module 30. For example, electrical pins 54 may be biased to deflect upward through opening 26 in tray 20.

Electrical pins 54 may have any suitable shape. For example, electrical pins 54 may include springs or wedges operative to contact module 30. Electrical pins 54 may be coupled to any suitable location or portion of wafer 52, for example to form a cantilever spring. Electrical pins 54 may be formed from any suitable conductive material (e.g., a metallic conductor, semiconductor, or superconductor) to communicate with electronic circuitry 32 of module 30.

Electronic circuitry 32 may be provided on first surface 31 of module 30 such that when placed in tray 20, electronic circuitry 32 of module 30 may face holder 24 of tray 20 and may be exposed through opening 26 of tray 20. This may allow electronic circuitry 32 to contact electrical pins 54 of wafer 52, as shown in FIG. 6. Tray 20 may include curved surfaces to prevent tray 20 from catching on electrical pins 54 when tray 20 is inserted or ejected from housing 18.

Electronic circuitry 32 can include any suitable integrated circuit (IC), such as a microchip, silicon chip, or computer chip that includes semiconductor and passive components that have been manufactured in the surface of a thin substrate of semiconductor material on surface 31 of module 30. The electrical contact between the semiconductor components and electrical pins 54 may allow wafer 52 to read data from or write data into module electronic circuitry 32. The data read from and written into electronic circuitry 32 may take any electrical form, for example digital or analog, and the communication between electronic circuitry 32 and wafer 52 may be synchronous or asynchronous.

Cage 40 may include one or more springs 41 on the cage surface facing module 30 for contacting and forcing or biasing removable module 30 towards holder 24. The force applied by springs 41 may also bias module 30 towards electrical pins 54 of wafer 52, thus enhancing electrical contact. Springs 41 may include any suitable type of spring, protrusion, wedge or other suitable component to force or bias module 30 towards wafer 52. For example, springs 41 may include a tension spring, extension spring, compression spring, torsional spring, wire spring, coil spring, flat spring, cantilever spring, helical spring, hairspring, balance spring, leaf spring, or any combination thereof. Alternatively, springs 41 may be protrusions operative to deflect Springs 41 may be coupled to cage 40 using any suitable approach or may instead or in addition be constructed as part of cage 40 (e.g., as a protrusion or cutout).

Figure 7:
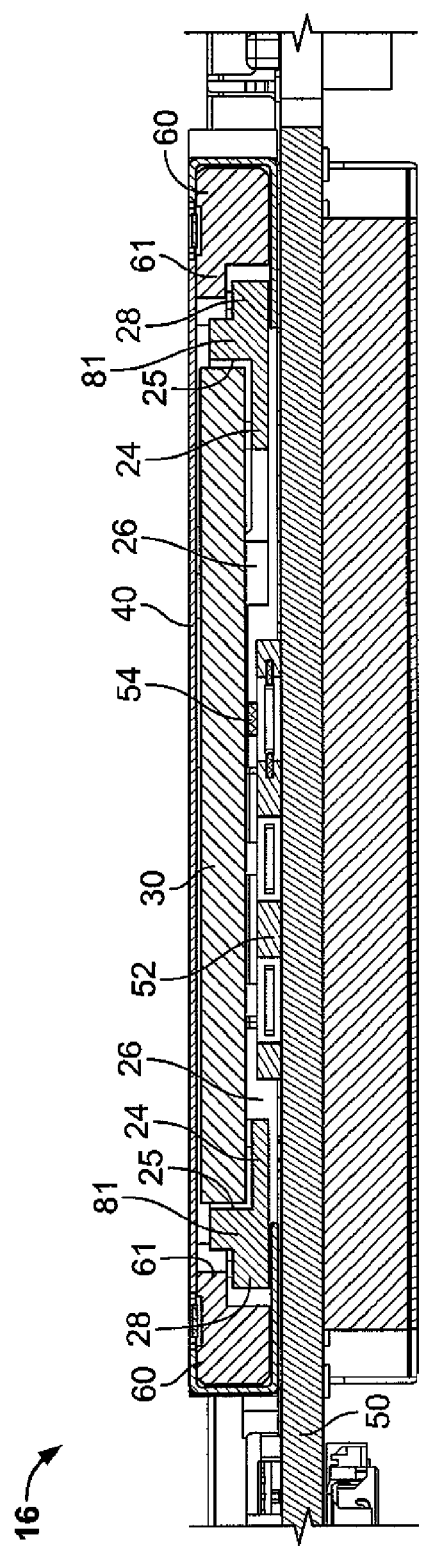
FIG. 7 is a cross-sectional view of the ejectable component assembly of FIG. 3 taken from line VII-VII of FIG. 3 in accordance with some embodiments of the invention.

FIG. 7 is a cross-sectional view of the ejectable component assembly of FIG. 3 taken from line VII-VII of FIG. 3 in accordance with some embodiments of the invention. In some embodiments, portions of tray 20 may lie in the same horizontal plane as electrical pins 54 and/or wafer 52 when tray 20 is being ejected from, fully inserted in assembly 16. This may reduce the height required to accommodate wafer 52 in assembly 16. For example, portions of wafer 52 may protrude into opening 26 of tray 20. By nesting wafer 52 with tray 20 the overall thickness or height of assembly 16 can be reduced by at least the thickness of tray 20. For example, the thickness or overall height of assembly 16 may be reduced (e.g., reduced by 0.30 mm, for example from 1.85 mm to 1.55 mm). As shown in FIG. 7, wafer 52 can protrude into opening 26 of tray 20 and be in the same horizontal plane as portions of tray 20.

As described above, retaining plate 60 may be operative to engage and retain tray 20. Retaining plate 60 can include retaining plate extension 61 constructed to complement tray protrusion 28 of tray 20. Plate extension 61 and tray protrusion 28 may form complementing features to assist in guiding tray 20 into assembly 16 (e.g., towards wafer 52) and to retain the periphery of tray 20.

Figure 8:
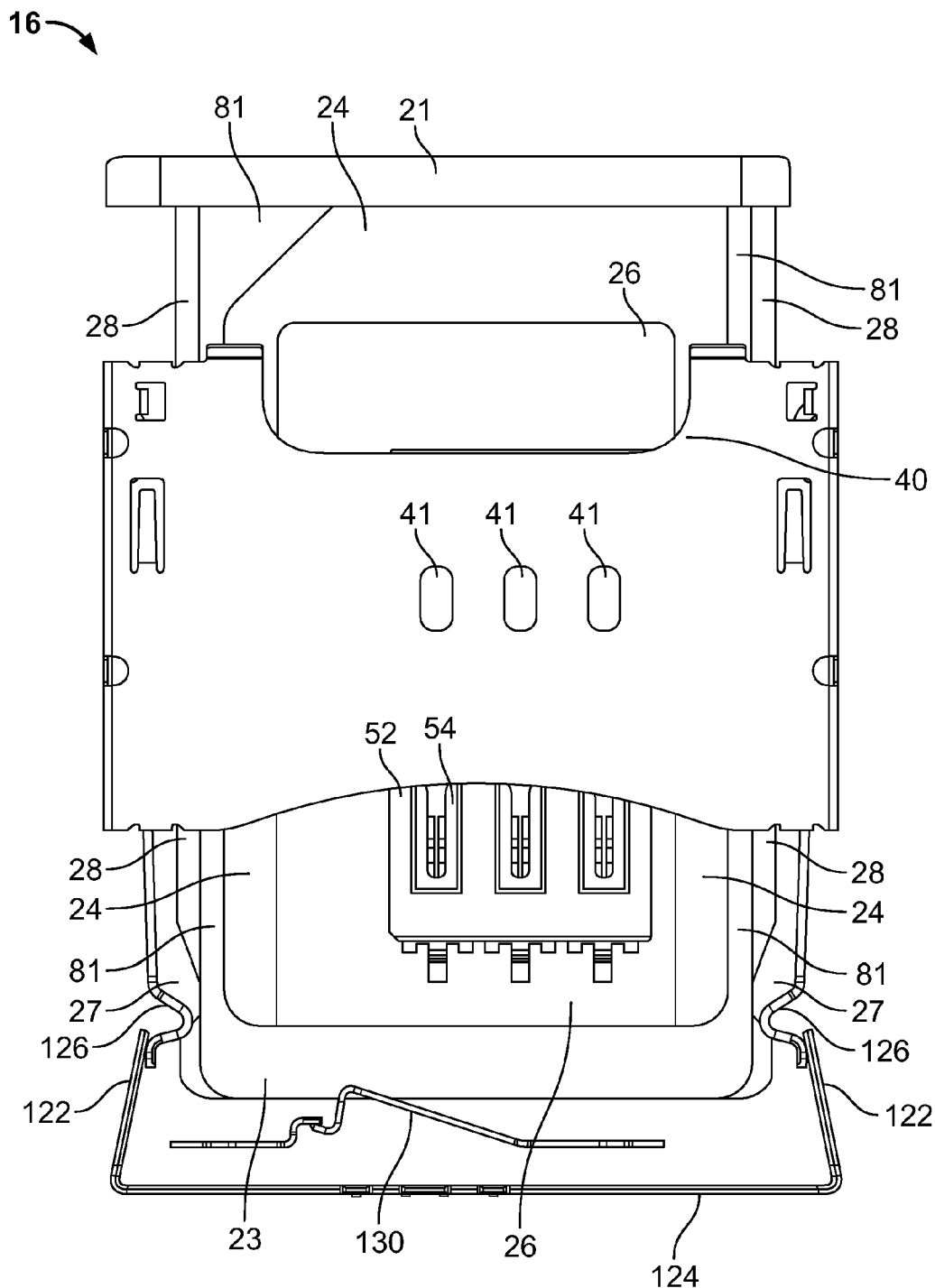
FIG. 8 is a top elevational view of a portion of the illustrative ejectable component assembly of FIG. 3 in accordance with some embodiments of the invention.

FIG. 8 is a top elevational view of a portion of the illustrative ejectable component assembly of FIG. 3 in accordance with some embodiments of the invention. In some embodiments, tray 20 may include at least one notch (e.g., detents 27) along tray protrusions 28. Detents 27 may be operative to receive a spring mechanism for holding tray 20 within assembly 16. Spring mechanisms 126 may be fixed at one end and biased towards tray 20. For example, detents 27 may be operative to receive spring mechanisms 126 such that when tray 20 is fully inserted in the electronic device, at least one spring mechanism 126 may engage at least one detent 27.

In some embodiments, electronic device 10 may include secondary spring 124 with spring arms 122. Spring arms 122 may be operative to apply pressure against spring mechanism 126 to retain spring mechanism 126 engaged in detents 27. This may increase the total force applied to detents 27 and further ensure that tray 20 remains substantially immobile within device 10.

Both the spring mechanisms 126 and the spring arms 122 may be displaced to disengage spring mechanisms 126 from detents 27 and eject tray 20 from electronic device 10. To assist in the ejection of tray 20, compression spring 130 may be coupled to retaining plate 60 such that compression spring 130 is placed behind and/or aligned with end 23 of tray 20 when tray 20 is inserted in assembly 16. When tray 20 is positioned in assembly 16, spring 130 may be compressed and exert a force on end 23 toward the exterior of the housing of the device. Then, as spring mechanisms 126 disengage from detents 27, spring 130 may decompress and exert a force on end 23 to eject tray 20.

Spring arms 122, secondary spring 124, spring mechanism 126, and compression spring 130 may be coupled to any suitable element within assembly 16 and/or device 10. Spring arms 122, secondary spring 124, spring mechanism 126, and compression spring 130 may be of any suitable shape and placed in any suitable location within assembly 16. These elements may be of any suitable spring type, for example, tension spring, extension spring, compression spring, torsional spring, wire spring, coil spring, flat spring, cantilever spring, helical spring, hairspring, balance spring, or leaf spring, or any combination thereof, as to effectively assist in ejecting and/or retaining tray 20. Spring arms 122, secondary spring 124, spring mechanism 126, and compression spring 130 may be formed of any suitable material, for example, plastic, glass, metal, ceramic raw materials, epoxies, concrete, plaster, clay, or composite materials, or any other suitable material, or combinations thereof. Additionally, these elements may be formed through any suitable method, for example, casting, molding, forming, forging, machining, or joining, or combinations thereof.

If one or more of the springs (i.e., spring arms 122, secondary spring 124, spring mechanism 126, or compression spring 130) are formed of a material or are coupled to an element that may store excess electrical charge, the springs may be grounded to circuit board 50 or another conductive element within device 10 to dissipate the excess charge. This may help avoid excess charges built up in the springs and prevent damage to components of assembly 16 and device 10.

Figure 9A:
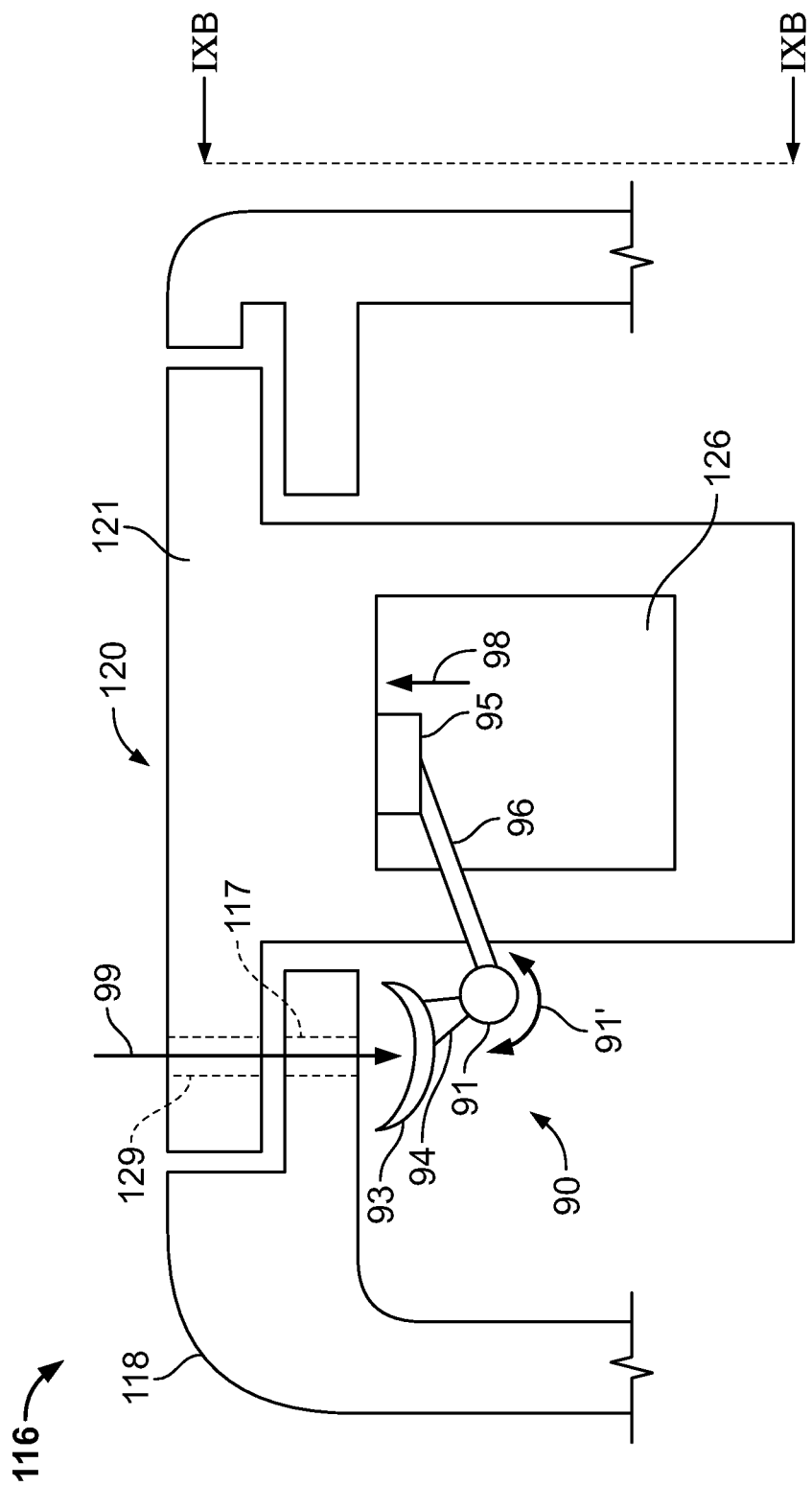
FIG. 9A is a top elevational view of an illustrative ejection mechanism for use with an ejectable component assembly in accordance with some embodiments of the invention.
Figure 9B:
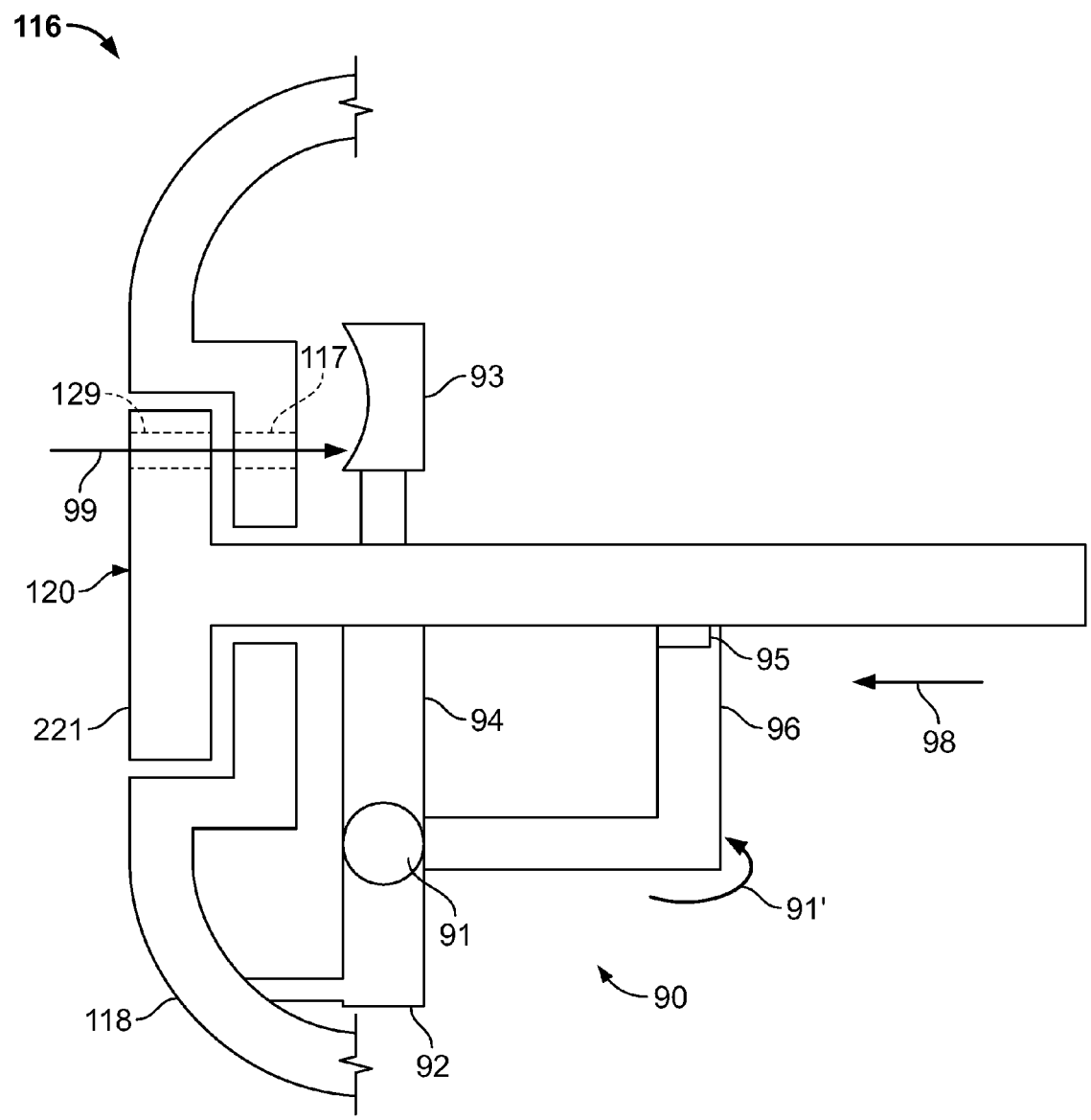
FIG. 9B is a cross-sectional view of the ejection mechanism of FIG. 9A taken from line IXB-IXB of FIG. 9A in accordance with some embodiments of the invention.

In some embodiments, the ejectable component assembly may include a mechanism for ejecting the tray. FIG. 9A is a top elevational view of an illustrative ejection mechanism for use with an ejectable component assembly in accordance with some embodiments of the invention. FIG. 9B is a cross-sectional view of the ejection mechanism of FIG. 9A taken from line IXB-IXB of FIG. 9A in accordance with some embodiments of the invention. A tray ejecting mechanism (e.g., tray ejector 90) for ejecting tray 120 from an electronic device (e.g., device 10, FIG. 1) may be incorporated in ejectable component assembly 116. Tray ejector 90 can include base 92 that may be coupled to the housing of the electronic device by pivot 91. Tray ejector 90 may also include actuating arm 94 that may extend from pivot 91 in a first direction and be coupled to user contact plate 93, and ejection arm 96 that may also extend from pivot 91 in a second direction and be coupled to tray contact plate 95. Tray ejector 90 can be provided such that actuating arm 94 and ejection arm 96 may pivot about pivot 91 in the direction of arrow 91'.

Tray ejector 90 can be provided such that actuating arm 94 may be biased with respect to pivot 91 (e.g., by a spring), whereby user contact plate 93 abuts or is substantially adjacent to the interior of housing 118 near tray hole 129 and housing hole 117. For example, a spring may exert a force on actuating arm 94 that may keep actuating arm 94 (and as a result user contact place 93) in place abutted with the interior of housing 118, absent any other forces. First end 121 of tray 120 may include first end tray hole 129. Tray hole 129 may be substantially aligned with a hole in the device's housing (e.g., housing hole 117) when tray 120 is inserted into ejectable component assembly 116. These holes may provide access to user contact plate 93 using a suitable instrument.

Using ejector 90, a user of the device may eject tray 120 from the electronic device to access a module holder or a module plated placed in the tray. For example, a user may insert a paperclip, pin, or any other suitable instrument through tray hole 129 and housing hole 117 (e.g., in the direction of arrow 99) to press user contact plate 93. The instrument may exert a force against user contact plate 93 in the direction of arrow 99 and cause actuating arm 94 to pivot about pivot 91 in the direction of arrow 91'. This may also cause ejection arm 96 to pivot in the same direction (e.g., both arms may pivot in the direction of arrow 91') and cause tray contact plate 95 to move in the direction of arrow 98, which is generally opposite to that of arrow 99. The movement of tray contact plate 95 may exert a force against tray 120, thereby forcing tray 120 in the direction of arrow 98 and releasing tray 120 from its retained position.

Tray contact plate 95 may contact any suitable portion of tray 120. In some embodiments, tray contact plate 95 may contact a portion of the bottom side of tray 120 that surrounds opening 126 (e.g., as shown in FIG. 9A for illustrative purposes). Tray contact plate 95 may have any suitable shape to exert force against tray 120. For example, tray contact plate 95 may be profiled (e.g., to help center the force against tray 120). As another example, user contact plate 93 may be curved or concave shaped, which may help keep the tip of a paperclip or other suitable instrument centered on the appropriate portion of the contact plate.

All the components of tray ejector 90 (e.g., pivot 91, base 92, user contact place 93, actuating arm 94, tray contact plate 95, and ejection arm 96) may be coupled to any suitable element within assembly 116 and/or the electronic device. For example, actuating arm 94 and ejection arm 96 may be positioned and sized to assist in ejecting tray 20 when the extension arms are pivoted about pivot 91. The elements included in tray ejector 90 may be formed of any suitable material, for example, plastic, glass, metal, ceramic materials, epoxies, composite materials, or any other suitable material.

If one or more of the elements are formed from a material or are coupled to an element that may store excess electrical charge, the elements may be grounded to a circuit board or another conductive element within the electronic device to dissipate the excess charge. This may help avoid excess charges built up in the elements damaging or corrupting the parts or processes taking place within assembly 116 and/or the device.

FIG. 10A is a cross-sectional view of the ejectable component assembly of FIG. 2 taken from line X-X of FIG. 2 when the tray is in a first position in accordance with some embodiments of the invention. FIG. 10B is a cross-sectional view of the ejectable component assembly of FIG. 2 taken from line X-X of FIG. 2 when the tray is in a second position in accordance with some embodiments of the invention. In some embodiments, tray 20 may include bridge 80. Bridge 80 may bridge a gap formed by protrusions 28 not connecting across opposite sides of tray 20. Bridge 80 may be in any suitable location in tray 20, for example along second end 23. The bottom of bridge 80 may be curved to help tray 20 avoid catching on elements within assembly 16 while being inserted or removed from assembly 16 (e.g., bridge 80 may slide over wafer 52). This may allow portions of wafer 52 to lie in the same horizontal plane as portions of tray 20.

Figure 11:
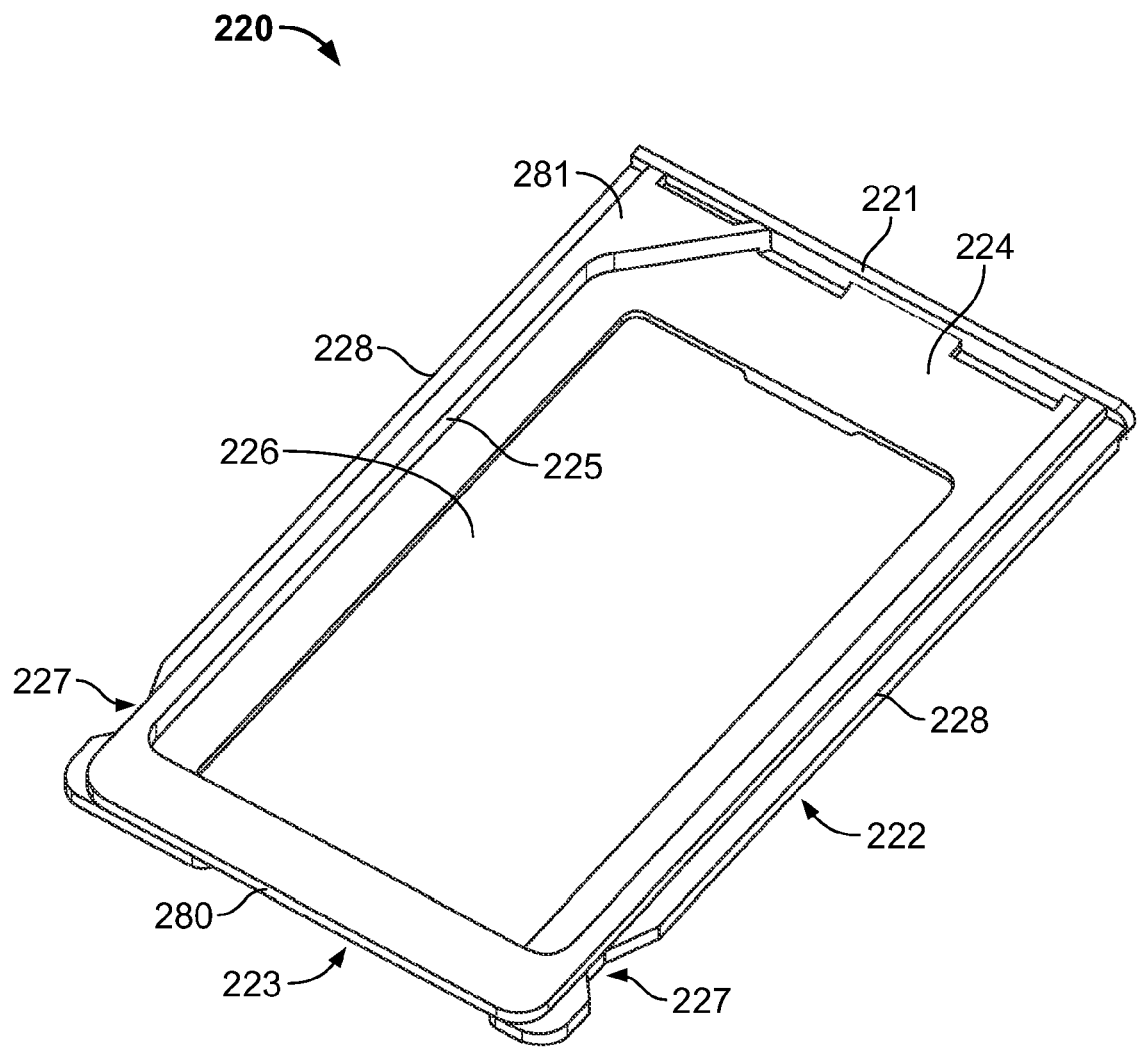
FIG. 11 is a perspective view of an illustrative module tray in accordance with some embodiments of the invention.
Figure 12:
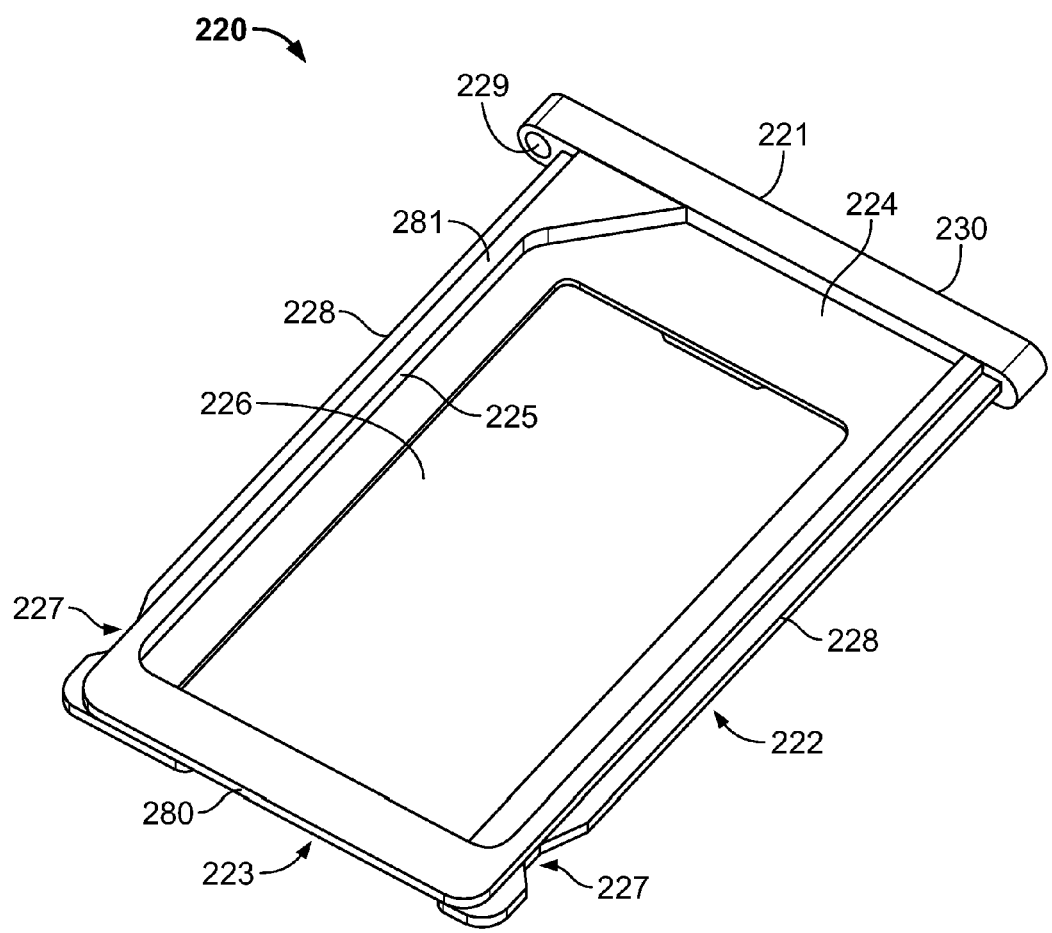
FIG. 12 is a perspective view of an illustrative module tray having a cosmetic outer surface in accordance with some embodiments of the invention.

FIG. 11 is a perspective view of an illustrative module tray in accordance with some embodiments of the invention. FIG. 12 is a perspective view of an illustrative module tray having a cosmetic outer surface in accordance with some embodiments of the invention. As described above in connection with tray 20 (FIG. 2), tray 220 may include first end 221, second end 223 and body portion 222.

Tray 220 may include module holder 224 incorporated in body portion 222 for holding a removable module. Holder 224 can be sized to substantially match that of a module (e.g., module 30, FIG. 5), such that the module can be snap-fitted or releasably retained in holder 224. Holder 224 may include opening 226 through which a portion of the removable module may be exposed. For example, opening 226 may allow electrical circuitry of the electronic device (e.g., electronic device 10, FIG. 1) to access data from the module through opening 226 when tray 220 is partially or fully inserted into the device. To reduce the profile of tray 220, at least three sides of tray 220 (e.g., all sides except for the side adjacent first end 221) may be lower than the top surface of a module placed in the tray.

Tray 220 may include protrusions 228 extending from body portion 222 to guide tray 220 within an electronic device assembly. The top of protrusions 228 may or may not be in the same horizontal plane as the top of step 281 and/or the top of module holder 224. In some embodiments, protrusions 228 may include detents 227. Detents 227 may be placed on the top, bottom, or various sides of tray 220 (e.g., side wall 225), protrusions 228, step 281, or module holder 224. The depth of detents 227 may be selected based on any suitable criteria, including for example to receive a spring mechanism for securing tray 220 in an assembly.

In some embodiments, the surfaces of tray 220 (e.g., first end 221, body portion 222, second end 223, module holder 224, side wall 225, detents 227, protrusions 228, bridge 280, or step 281) may be curved to prevent tray 220 from catching on elements within an assembly or device when tray 220 is inserted or ejected from the housing.

In some embodiments, first end 221 may as shown in FIG. 12. Cosmetic surface 230 may include first end tray hole 229, which may be placed anywhere along cosmetic surface 230 and have any suitable size and shape. Tray hole 229 may be cylindrical to allow any suitable instrument enter the interior of the housing of a device and manipulate an assembly. For example, the instrument may be used to assist in ejecting tray 220 from the housing.

Tray 220, or portions of tray 220, can be formed using any suitable process and any suitable material. Suitable processes may include casting, molding, forming, forging, machining, joining, other suitable process. In some embodiments, or any tray 220 can be formed using an injection molding technique, for example, a double shot injection molding technique. Suitable materials for tray 220 may include plastic, glass, metal, ceramic materials, epoxies, or composite materials, or any other suitable material.

If tray 220 is formed of a conductive material, tray 220 can be anodized and coated such that it may be insulated and rendered substantially not conductive. To further avoid electrical shock to the device, one or more portions of anodized metal tray 220 can be exposed, for example by laser etching, to contact one or more grounding portions of the assembly to remove the charge. The grounding portions may be made of any suitable conductive material and may be placed in any suitable location as to effectively contact the exposed portions of tray 20 when tray 20 is fully inserted or as tray 20 is being inserted into device 10.

While there have been described electronic devices with compact ejectable component assemblies, it is to be understood that many changes may be made therein without departing from the spirit and scope of the invention. It will also be understood that various directional and orientational terms such as "upper" and "lower," "length" and "height," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the invention may be of any suitable three-dimensional shape, including, but not limited to, a sphere, cone, octahedron, or combination thereof, rather than a hexahedron, as illustrated by FIGS. 1-12. Those skilled in the art will appreciate that the invention can be practiced by other than the described embodiments, which are presented for purposes of illustration rather than of limitation, and the invention is limited only by the claims which follow.

What is claimed is:

1. An ejectable tray for use in an electronic device, the ejectable tray comprising:
   a first tray end having an outer surface that forms part of an exterior surface of the electronic device;
   a second tray end configured to be inserted into an opening of a housing of the electronic device; and
   a body portion formed between the first and second tray ends, the body portion forming a pair of opposing rails extending between the first and second tray ends, the pair of opposing rails configured to hold and contact a first side of a removable card module, and defining an opening exposing at least a portion of the first side, wherein a circuit board of the electronic device is configured to electrically connect to the first side through the opening when the tray is inserted in the electronic device, wherein the first tray end forms a side wall along an edge of the removable card module of a height that is less than a thickness of the removable card module.

2. The ejectable tray of claim 1, wherein the removable card module is a subscriber identity module (SIM).

3. The ejectable tray of claim 1, wherein:
   the body portion and the second tray end form three side walls surrounding the removable card module; and
   the three side walls have a height that is less than a thickness of the removable card module.

4. The ejectable tray of claim 1, wherein the body portion include a detent that is configured to engage with a spring located within the housing to retain the ejectable tray within the housing.

5. The ejectable tray of claim 1, wherein the outer surface of the first tray end is flush with the exterior surface of the housing of the electronic device.

6. The ejectable tray of claim 1, wherein the first tray end includes a tray hole for receiving an instrument used to eject the ejectable tray from the housing of the electronic device.

7. An electronic device comprising:
   a housing having an opening;
   a circuit board disposed within the housing;
   a tray operative to receive a removable card module, the module in communication with the circuit board when the tray is inserted in the housing, the tray comprising:
   a first end that forms an exterior surface of the electronic device;
   a second end configured to be inserted into the opening of the housing; and
   a body portion connecting the first and second ends, wherein the body portion defines a pair of rails extending from the first end, the pair of rails configured to hold a first surface of the removable card module, the pair of rails defining an inner opening exposing at least a portion of the first surface, wherein the circuit board electrically connects to the first surface through the inner opening when the tray is inserted in the housing, the body portion and the second end form two or more side walls that surround the removable card module and the two or more side walls have a height that is lower than an upper surface of the removable card module.

8. The electronic device of claim 7, wherein the removable card module is a subscriber identity module (SIM).

9. The electronic device of claim 7, further comprising:
   a cage positioned over the tray when inserted in the housing, wherein the cage holds the removable card module within the tray when the tray is inserted in the housing.

10. The electronic device of claim 9, wherein:
    the cage is attached to the circuit board and is positioned over a second surface of the removable card module when the tray is inserted; and
    the second surface is opposite to the first surface of the removable card module that is configured to electrically couple with the circuit board.

11. The electronic device of claim 7, wherein the first end includes a tray hole for receiving an object that is used to eject the tray from the housing.

12. The electronic device of claim 7, wherein the body portion include a notch that is configured to engage with a spring located within the housing to retain the tray within the housing.

13. A tray of an electronic device, the tray comprising:
    a body portion including two side walls that are configured to retain a subscriber identity module (SIM) card within the tray, the two side walls configured to connect a lower surface of the SIM card, the body portion defining a void exposing at least a portion of the SIM card;
    a first end formed at a first end of the body portion, the first end having a cosmetic outer surface; and
    a second end formed at a second end of the body and configured to be inserted in an opening of a housing;
    wherein a circuit board of the electronic device electrically connects to the lower surface through the void when the tray is inserted within the housing;
    wherein the side walls of the body portion have a height that is lower than an upper surface of the SIM card when the SIM card is positioned in the tray.

14. The tray of claim 13, wherein the body portion include a detent that is configured to engage with a spring located within the housing to retain the tray within the housing.

15. The tray of claim 13, wherein:
    the lower surface of the SIM card comprises a conductive surface of the SIM card.

16. The tray of claim 13, wherein the first end includes a tray hole for receiving an object that is used to eject the tray from the housing.

17. The tray of claim 13, wherein the second end includes a wall that is configured to retain the SIM card within the tray, wherein the wall has a height that is lower than the upper surface of the SIM card.

\* \* \* \* \*